(12) United States Patent
Centola et al.

(10) Patent No.: US 10,905,038 B1
(45) Date of Patent: Jan. 26, 2021

(54) ELECTROMAGNETIC INTERFERENCE ("EMI") SHEET ATTENUATORS

(71) Applicant: Google LLC, Mountain View, CA (US)

(72) Inventors: Federico Pio Centola, San Jose, CA (US); Zuowei Shen, Los Altos, CA (US); Xu Gao, Mountain View, CA (US); Shawn Emory Bender, Campbell, CA (US); Melanie Beauchemin, Mountain View, CA (US); Mark Villegas, Mountain View, CA (US); Gregory Sizikov, Mountain View, CA (US); Chee Yee Chung, Milpitas, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/688,384

(22) Filed: Nov. 19, 2019

(51) Int. Cl.
*H05K 9/00* (2006.01)

(52) U.S. Cl.
CPC .......... *H05K 9/0043* (2013.01); *H05K 9/009* (2013.01); *H05K 9/0088* (2013.01); *H05K 9/0094* (2013.01)

(58) Field of Classification Search
CPC ..... H05K 9/0088; H05K 9/0094; H05K 9/009
See application file for complete search history.

(56) References Cited

U.S. PATENT DOCUMENTS

| 5,349,132 | A | * | 9/1994 | Miller | G06F 1/181 |
| | | | | | 174/372 |
| 8,039,074 | B2 | * | 10/2011 | Gotou | B32B 15/20 |
| | | | | | 428/40.1 |
| 2013/0255998 | A1 | * | 10/2013 | Iwami | H05K 9/0094 |
| | | | | | 174/250 |
| 2014/0240159 | A1 | * | 8/2014 | Lawrence | H01Q 15/0013 |
| | | | | | 342/1 |
| 2018/0108618 | A1 | * | 4/2018 | Yamamoto | C23C 14/0641 |

\* cited by examiner

*Primary Examiner* — Hung V Ngo
(74) *Attorney, Agent, or Firm* — Lerner, David, Littenberg, Krumholz & Mentlik, LLP (57) ABSTRACT

An electromagnetic interference ("EMI") sheet attenuator includes a planar conductive layer, a first flexible substrate and a second flexible substrate. The first flexible substrate overlies the metal backing layer and including a conductive pattern on a surface of the first flexible substrate. The second flexible substrate overlies the first flexible substrate and also includes the conductive pattern. The conductive pattern on the second flexible substrate is aligned with the conductive pattern on the first flexible substrate.

20 Claims, 5 Drawing Sheets

ELECTROMAGNETIC INTERFERENCE ("EMI") SHEET ATTENUATORS

FIELD OF THE DISCLOSURE

The present disclosure relates to methods and devices for minimizing electromagnetic interference and emissions caused by electronic devices, including mobile telephones, laptops, computers, optical transceivers, server or networking racks, and the like. The disclosure also relates to electromagnetic shielding used to minimize impinging electromagnetic waves and interference.

BACKGROUND

Various methods and devices are used to decrease unintentional radiated emissions from electronic devices. Localized shielding on a printed circuit board ("PCB"), filters, bandstop filters, absorbing materials, and customized PCB layouts, are techniques commonly implemented to decrease radiated emissions. With regard to shielding enclosures, the purpose of the enclosure is to contain the energy of the radiated emissions within the enclosure, but any opening within the enclosure can result in electromagnetic field leakage. For example, in optical transceivers, an opening is required for the optical fibers to connect with their modules resulting in electromagnetic field leakage. The sizes of such openings may also be resonant at one or more frequencies of interest, thereby amplifying the overall radiated emission level at some frequencies. It is also quite common that a select few radiated emissions harmonics are significantly higher than others and in order to suppress them to an acceptable level, the shielding of the enclosure needs to be improved.

Using known enclosures and methods of shielding, it is not possible to increase the shielding effectiveness at just one frequency. Instead, the entire enclosure must be redesigned. There are many drawbacks to a redesign, in addition to the time and cost needed to redesign. It may be difficult to achieve the desired shielding without having an impact on thermal performance, serviceability and cost. This is particularly true when the highest harmonic that needs to be suppressed is within the highest of frequencies. Indeed, increasing the shielding performance of the enclosure to achieve the desired high frequency shielding effectiveness considering all other design constraints (mechanical, thermal, need for connector apertures, cost, and the like) may not be possible in certain circumstances.

BRIEF SUMMARY

An electromagnetic interference ("EMI") sheet attenuator according to an aspect of this disclosure includes a planar conductive layer, a first flexible substrate and a second flexible substrate. The first flexible substrate overlies the planar conductive layer and includes a conductive pattern on a surface of the first flexible substrate. The second flexible substrate overlies the first flexible substrate and also includes the conductive pattern. The conductive patterns on the second flexible substrate may be aligned with the conductive patterns on the first flexible substrate. Multiple flexibles substrates with conductive patterns on their surfaces can also be overlaid on each others.

In one example, the first and second printed patterns of the EMI sheet attenuator are comprised of a conductive ink material.

In another example, the first and second flexible substrates each further include respective top and bottom surfaces. The conductive may be positioned on the top surfaces of the first substrate and the top surface of the second substrate. The planar conductive layer may also further include a top surface and a bottom surface, wherein the bottom surface of the first substrate is joined to the top surface of the planar conductive layer. An adhesive layer may join the first substrate and the metal layer together.

In another example, the metal layer may be comprised of a metal sheet of material, or may be a substrate with a metal material coated thereon.

In still another example, the first flexible substrate of the EMI sheet is comprised of a paper material or a transparent plastic material.

In yet another example, the first flexible substrate and the second flexible substrate may be comprised of a dielectric material.

In still another example, the EMI sheet is configured to reflect wave impedance in both a near field and a far field.

According to another aspect of the disclosure, an enclosure for an electronic device includes at least a first wall and a second wall joined together at their respective ends. The first wall may include a first interior surface and the second wall may include a second interior surface. A first electromagnetic ("EMI") sheet attenuator may be positioned at the first interior surface. A second EMI sheet attenuator may be positioned on the second interior surface. Each of the first and second EMI sheet attenuators may include a planar conductive layer, a first flexible substrate and a second flexible substrate. The first flexible substrate may overlie the planar conductive layer and include pattern on a surface of the first flexible substrate. The second flexible substrate may overlie the first flexible substrate and also includes the conductive pattern. The conductive pattern on the second flexible substrate may be aligned with the conductive pattern on the first flexible substrate.

In one example, one of the wall surfaces may further include an opening through which the electronic device extends.

In another example, the first conductive patterns and second conductive patterns of each of the first and second EMI sheet attenuators are periodic structures.

In yet another example, the conductive patterns on the first and second flexible substrates are periodic structures.

According to still another example, the conductive patterns on the first and second conductive substrates are different.

In one example, the enclosure further includes a third wall, a fourth wall, a fifth wall, and a sixth wall that together with the first and second walls extend about all sides of the electronic device. A third EMI sheet attenuator may be attached to the third wall. A fourth EMI sheet attenuator may be attached to the fourth wall. A fifth EMI sheet attenuator may be attached to the fifth wall. A sixth EMI sheet attenuator may be attached to the sixth wall.

In another example, the conductive patterns disposed at the first and second flexible substrates are comprised of conductive ink material.

In still another example, the planar conductive layers of the respective first and second flexible substrates further include a top surface and a bottom surface, and wherein each of the bottom surfaces of the first substrates of the first and second flexible substrates is joined to the top surface of the planar conductive layer.

In another example, an adhesive layer joins the first flexible substrate and the planar conductive layer together.

In a last example, the first EMI sheet is configured to reflect wave impedance in both a near field and a far field.

It is to be noted that the features of the above-described arrangements are not exclusive to each other, and that any one of such features and arrangements can be combined with one or more of the other features and arrangements to arrive at further aspects of the disclosure.

BRIEF DESCRIPTION OF THE DRAWINGS

A more complete appreciation of the subject matter of the present disclosure may be realized by reference to the following detailed description and the accompanying drawings, in which.

DETAILED DESCRIPTION

Aspects of the disclosure relate to methods and devices for minimizing electromagnetic interference caused by electronic devices. In particular, a multi-layer electromagnetic interference ("EMI") sheet attenuator is disclosed that can suppress an impinging wave and wave frequencies generated by an electronic device without requiring further modifications to the design of the shielding enclosure, the printed circuit board, or other parts of the system. It is possible to reduce the radiated emissions at certain frequencies by depositing EMI sheet attenuators with patterned structures to enclosure walls used to directly or indirectly house a device to attenuate the radiofrequency ("RF") energy inside the enclosure. These patterned structures have a frequency dependent impedance which depends on their geometry. By designing the geometry with an impedance close to the impinging wave impedance, reflections from the enclosure walls can be attenuated and leakage from the enclosure reduced.

Figure 1:
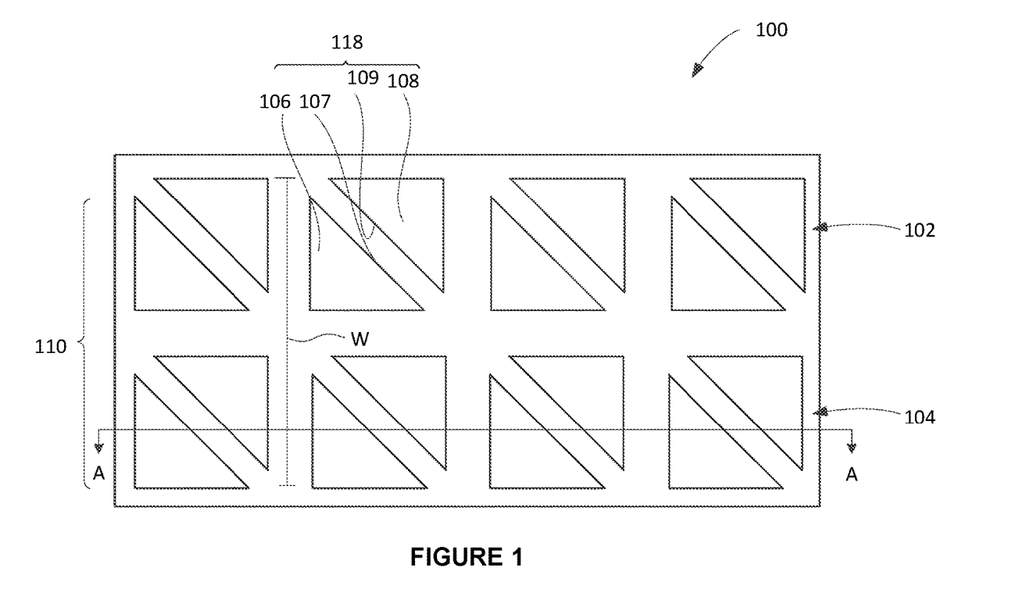
FIG. 1 is a top plan view of an example electromagnetic sheet attenuator according to an aspect of the disclosure.

FIG. 1 is an example multi-layer EMI sheet attenuator 100 according to aspects of the disclosure. The EMI sheet attenuator 100 can be used to reduce radiated emissions from electronic devices and the like. In particular, a patterned structure 110 on the EMI sheet attenuator 100 can attenuate the radiofrequency energy that radiates from an electronic device or the like. EMI sheet attenuator 100 is shown as being planar, but sheet attenuator 100 may also take on other configurations. EMI sheet attenuator 100 may have an overall thickness ranging from less than 1 mm to a few mm. In some examples, the overall thickness may be less than 1 mm so as to maintain an EMI sheet attenuator 100 that is overall thin and flexible. In other examples, the overall thickness may be greater than 5 mm or significantly less than 1 mm. In some examples, the thickness may be greater than 5 mm or significantly less than 1 mm Due to the thickness, EMI sheet attenuator 100 can be overall thin and flexible.

A patterned structure may be provided on the first substrate layer 130 that is designed to match any desired wave impedance or frequency, such as the impedance of the wave to be emitted by an electronic device. Patterned structure 110 on EMI sheet attenuator 100 may include multiple rows of repeating patterns. For example, EMI sheet attenuator 100 includes first and second rows 102, 104 of sets of patterned triangles or eight sets of patterned triangles. Each set 118 of triangles includes a lower triangle 106 having its hypotenuse 107 facing the hypotenuse 109 of a directly adjacent upper triangle 108. The upper triangle 108 and lower triangles 106 may be spaced apart from one another to form a pattern. Four identical sets of patterned triangles may be provided in first row 102 and four identical sets of patterned triangles may also be provided in second row 104. As will be discussed below, patterned structure 110 includes multiple sets of triangles formed on individual layers of the multi-layer EMI sheet attenuator 100 that align with one another to form the patterned structure 110 of EMI sheet attenuator 100. It is to be appreciated that in the present example, patterned structure is a periodic structure, but in other examples, the patterned structure may not be a periodic structure.

EMI sheet attenuator 100 may include multiple layers attached together. As shown, for example, in FIG. 2, a cross sectional view taken across line A-A of FIG. 1, the EMI sheet attenuator 100 may include at least three primary layers: a conductive layer 120, a first substrate layer 130 with a patterned structure 110A, and a second substrate layer 140 with a patterned structure 110B. The three layers may be joined together by adhesive layers 150,152. The conductive layer 120 can be optional if the sheet attenuator structure has to be applied onto a metal surface or conductive surface.

Figure 3:
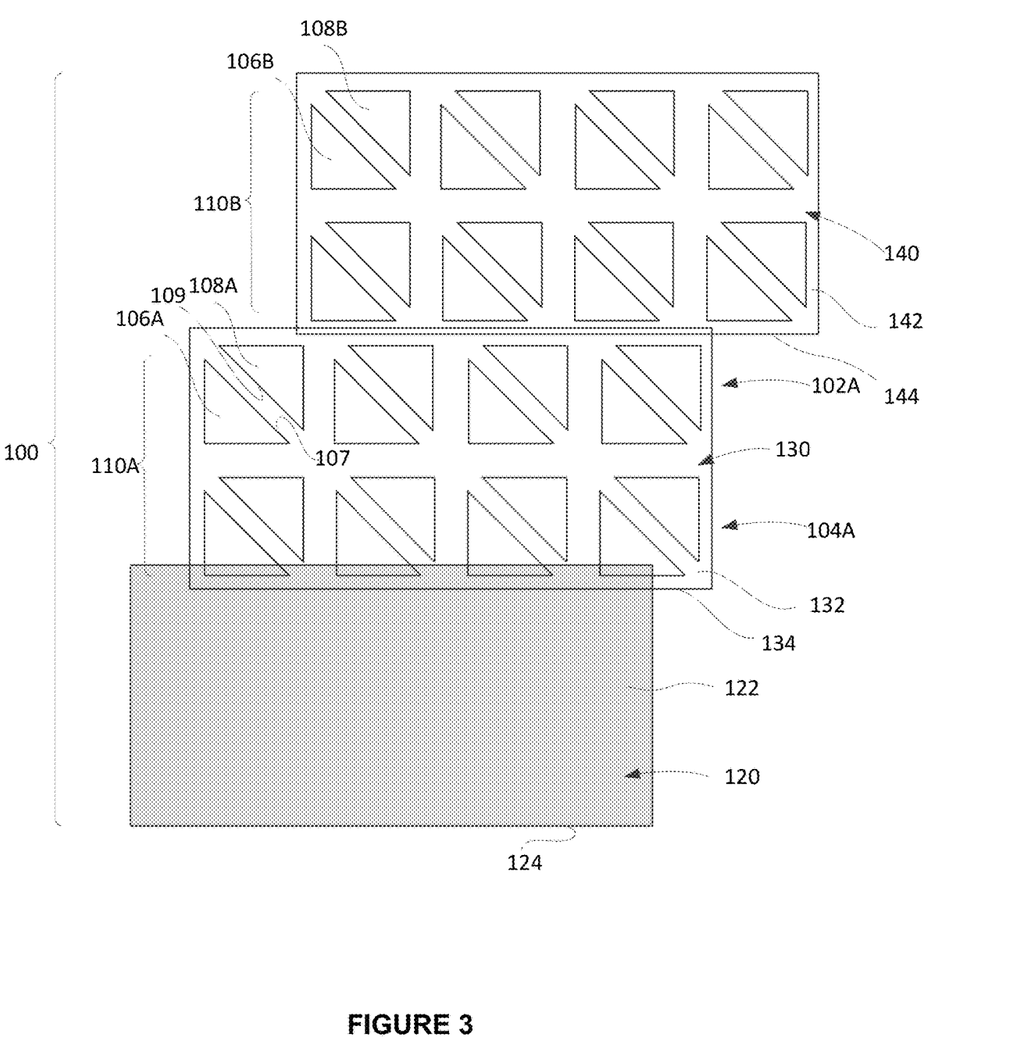
FIG. 3 is an exploded view of FIG. 1 (with certain features omitted for ease of discussion)

With reference to FIG. 3, an exploded view of FIG. 1 (but without illustration of intermediate adhesive layers 150,152 for ease of discussion), conductive layer 120 may be a continuous and planar layer. Conductive layer 120 may be a sheet of metal material or may be a substrate with a conductive layer disposed at a surface of the substrate. The conductive material may be a conductive metal including, for example, copper, iron, aluminum, tantalum, silver, brass, alloys, graphene, graphite, carbon based materials and combinations thereof. When conductive layer 120 is a coated substrate, conductive layer can be manufactured using various methods, including sputtering a metallic coating onto a substrate, inkjet printing, chemical and physical vapor deposition, and the like. In other examples, conductive layer 120 may be a substrate with a patterned metal layer on a surface of the substrate. Conductive layer 120 may be a thin metal layer that is only a few microns thick, and in some examples ranging from 1 mm to a few millimeters thick.

First substrate layer 130 can overlie conductive layer 120, and may also be a continuous and planar layer. First substrate layer 130 may be formed from a dielectric material or combination of dielectric materials and/or other materials, such as, for example, plastic or paper. Examples of plastic material may further include vinyl, polyester-based films, HDPE, and polypropylene. First substrate layer may be 100 microns thick, and in some examples ranging from few tens of microns to a few millimeters, but in general no greater than 1 cm thick. Due to the relatively thin substrate layers 130, 140, the entire layered structure may be flexible. In the example shown, first substrate layer 130 is a transparent plastic material.

A patterned structure may be provided on the first substrate layer 130 that is designed to match any desired wave impedance or frequency, such as the impedance of an impinging wave emitted by an electronic device. For example, with reference to FIG. 3 and as noted above, patterned structure 110A may be a series of repeating triangle patterns extending across the sheet. EMI sheet attenuator 100 may include first and second rows 102A, 104A of sets of patterned triangles or eight sets of patterned triangles. Each set of triangles includes a lower triangle 106A having its hypotenuse 107A facing the hypotenuse 109A of a directly adjacent upper triangle 108A. Upper triangle 108A and lower triangle 106A may be spaced apart from one another to form a single pattern, which may then be repeated across each of first and second rows 102A, 104A.

In one example, the patterned structure is printed on the first substrate layer 130 using conductive ink. The conductive ink may be composed of graphite, silver and/or other conductive materials infused into ink. The ink may be printed onto the first substrate layer 130 using known methods and based on the material forming the substrate layer 130. For example, when first substrate layer 130 includes or is made from a plastic material, the conductive ink can be printed onto the first substrate layer using an inkjet printer or a method of printing or deposition that does not generate heat that would melt a plastic substrate. Alternatively, when the substrate is not heat sensitive, such as a paper substrate, alternative forms of printing, such as use of a laser printer, can be implemented to print the conductive ink onto the first substrate layer 130. The patterned structures 110 may be provided onto the first substrate layer 130 using other known methods, including lamination, etching, and the like.

The second substrate layer 140 may be identical to or different than first substrate layer 130. In one example, as shown in FIG. 3, second substrate layer 140 may be a transparent plastic material that is identical in all respects to the first substrate layer 130. The material comprising second substrate layer may be a same dielectric material and thickness as the first substrate layer 130.

In this example, the patterned structure 110B of second substrate layer 140 is also formed from a conductive ink printed on the first substrate layer 130. Patterned structure 110B may be identical to patterned structure 110A of first substrate layer 130 and includes four sets of triangles. Patterned structure 110B may be positioned on second substrate layer 140 so that it is aligned with patterned structure 110A on first substrate layer 130. In other examples, second substrate layer 140 can differ from the first substrate layer 130, in terms of insulating properties, thickness of the material, the material comprising second substrate layer 140, patterned structure on second substrate layer 140, and any other desired features.

A protective layer (not shown) can optionally be provided on top surface of second substrate layer 140. Protective layer can overlie patterned structure 110B to protect patterned structure 110B from being damaged. The protective layer can be made of another layer of plastic or substrate material or may be a coating applied over the outermost patterned structure 110B.

Conductive layer 120, first substrate layer 130 and second substrate layer 140 may be joined together to form EMI sheet attenuator 100. As shown, the bottom surface 134 of the first substrate layer 130 may be joined to the top surface 122 of the conductive layer 120. Similarly, bottom surface 144 of second substrate layer 140 may be joined to the top surface of first substrate 130. Top surface 142 of second substrate layer 140 can remain exposed. It is to be noted that conductive layer 120 can be optional if the assembled and layered EMI sheet structure has to be applied to a metal surface, such as with use of an adhesive.

In one example, an adhesive may be used to attach each of the conductive layer 120, first substrate layer 130, and second substrate layer 140 together to form EMI sheet attenuator 100. Example adhesives can include polymer adhesives, such as epoxies, silicones, acrylics, polyimides, cyanate esters, and various thermoplastic materials. The adhesive may be uniformly applied across one or both surfaces that are joined together. For example, an adhesive may be applied between top surface 122 of conductive layer 120 and bottom surface 134 of first substrate layer 130, as well as between top surface 132 of first substrate layer 130 and bottom surface 144 of second substrate layer 140. An adhesive may also be applied to bottom surface 124 of conductive layer 120 to attach EMI sheet attenuator 100 to another surface. In other examples, alternative methods of joinder may be utilized, such as pressing the layers together, mechanical fasteners, and any other methods of joining each of the conductive layer 120, first substrate layer 130, and second substrate layer 140. Additionally, different methods for joining the layers may be utilized in the formation of EMI sheet attenuator 100. For example, second first substrate layer 130 may be joined to conductive layer 120 using one method of joinder and the second substrate layer 140 may be joined to first substrate layer 130 by a different method.

Figure 2:
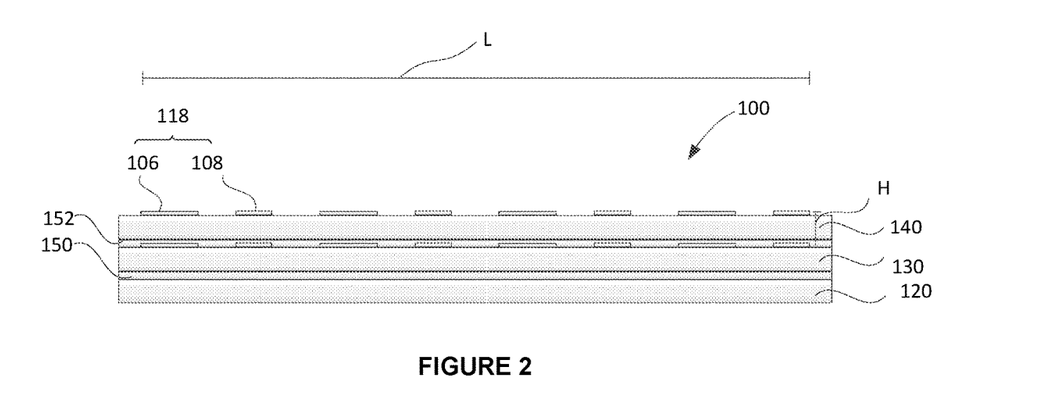
FIG. 2 is a cross-sectional view taken across line A-A of FIG. 1.

When joined together, the aligned patterned structures 110A, 110B form the patterned structure 110 of EMI sheet attenuator 100. As shown in FIG. 2, patterned structure 110 becomes a stacked and three-dimensional structure that includes a height H, a width W, and a length L. Patterned structure 110 can help to block impinging waves from an electronic device or the like, as will be discussed in more detail.

Figure 4:
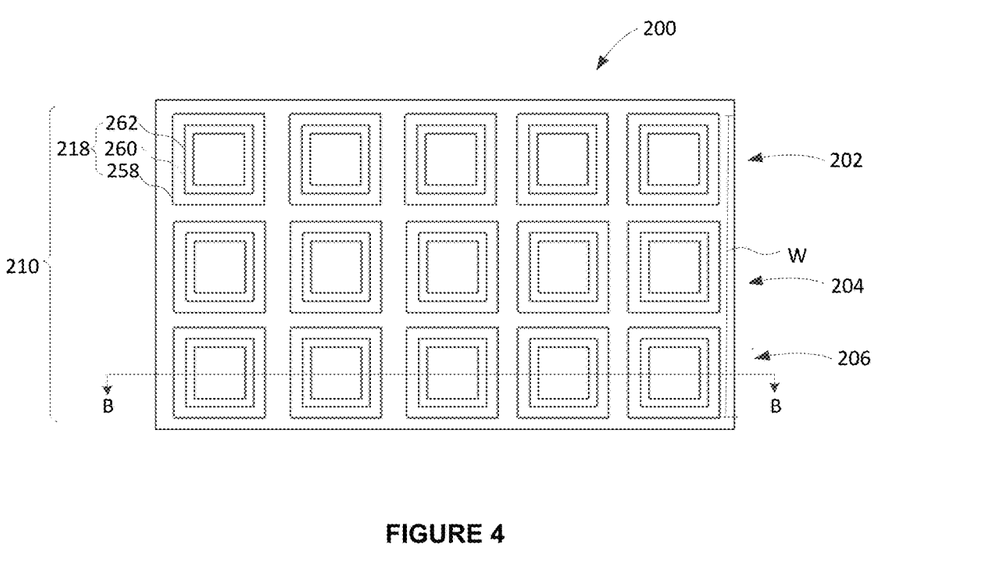
FIG. 4 is a top plan view of another example electromagnetic sheet attenuator according to an aspect of the disclosure.
Figure 5:
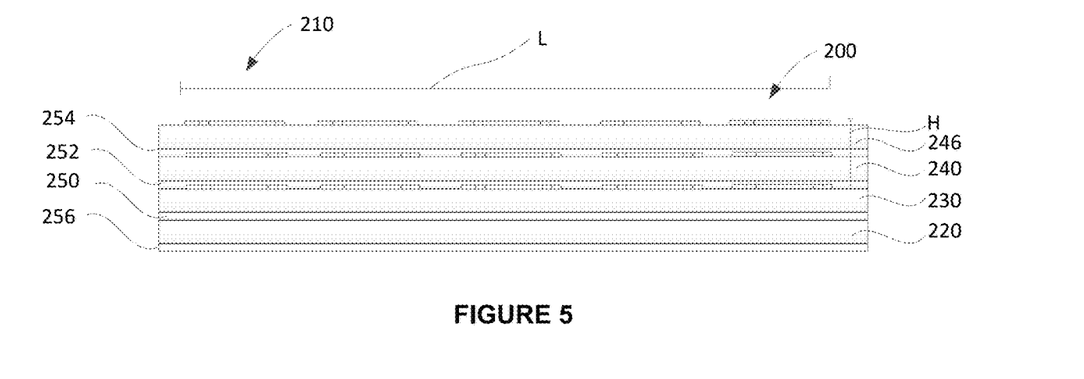
FIG. 5 is a cross-sectional view taken across line B-B of FIG. 4.

It is to be appreciated that any desired patterned structure may be provided on the EMI sheet attenuator. Radiated emissions can be attenuated by EMI Sheet attenuators by designing the geometry of the patterned structure with an impedance close to the imping wave impedance. This allows for the design of a specific patterned structure to target a specific frequency. FIG. 4 illustrates an alternative multiple layer EMI sheet attenuator 200. The EMI sheet attenuator 200 may be manufactured from the same or similar materials as EMI sheet attenuator 100, as discussed above. With reference to FIG. 5, a cross-sectional view of EMI sheet attenuator 200, EMI sheet attenuator 200 includes four primary layers: conductive layer 220, first substrate layer 230, second substrate layer 240, and third substrate layer 246. Each of the layers may be attached together using adhesive layers 250, 252, and 254. An additional adhesive layer 256 may be applied to conductive layer 220 to join the EMI sheet attenuator 100 to another structure.

EMI sheet attenuator 200 includes a patterned structure 210. In this example, patterned structure 210 includes a first row 202, a second row 204, and a third row 206 of sets of patterned squares. Each set 218 of patterned squares includes three concentric squares. As shown, a first outer square 258, a second intermediate square 260, and a third interior square 262 respectively decrease in size to provide for a set 218 of concentric squares. Four identical sets of patterned and concentric squares may be provided in each of first row 202, second row 204, and third row 206. As in the previous example, patterned structure 210 will be comprised of multiple sets of patterned squares formed on individual layers of the multi-layer EMI sheet attenuator 200 that align with one another to form the patterned structure 210 of EMI sheet attenuator 200.

Figure 6:
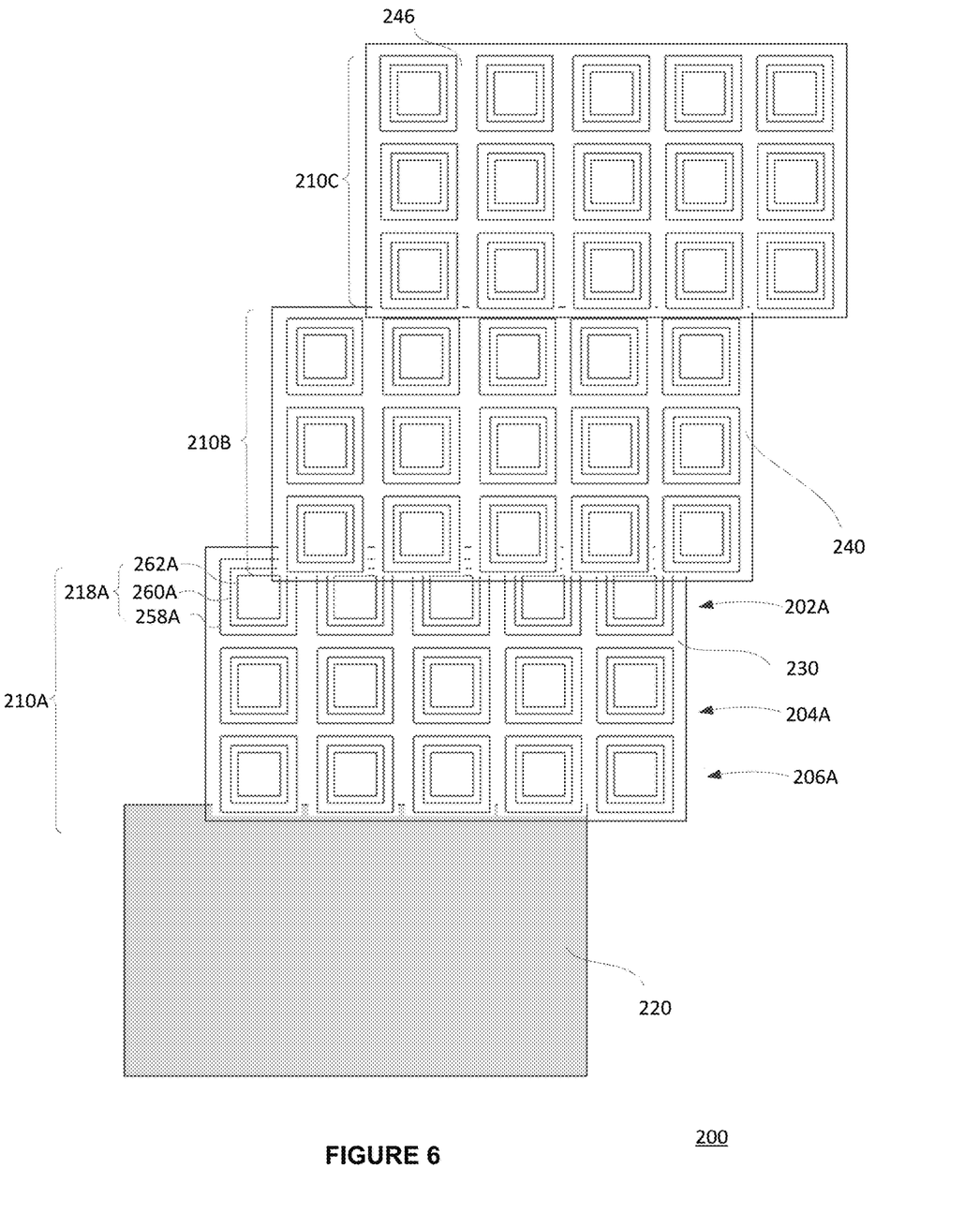
FIG. 6 is an exploded view of FIG. 4 (with certain features omitted for ease of discussion)

FIG. 6 is an exploded view of FIG. 4 (without adhesive layers 250, 252, 254, 256 for ease of discussion). Conductive layer 220 may be a planar metal sheet or a layer of metallic material provided on a substrate, as previously disclosed above. Each of the first substrate layer 230, second substrate layer 240, and third substrate layer 246 may be identical to the substrate layers discussed above and differ only with regard to the patterned structures provided on each of the substrate layers, as well as the location of the patterned structure.

Patterned structure 210A of first substrate layer 230 may include a first row 202A, a second row 204A, and a third row 206A of sets of patterned squares. Each set of patterned squares includes three concentric squares. As shown, a first outer square 258A, a second intermediate square 260A, and a third interior square 262A respectively decrease in size to provide for a set 218A of patterned and concentric squares. Four identical sets of patterned and concentric squares may be provided in each of first row 202A, second row 204A, and third row 206A. The same patterned structures 210B and 210C may be printed on respective second substrate layer 240 and third substrate layer 246. As shown in FIG. 5, each of the patterned structures 210A, 210B, 210C may be aligned with one another to form the overall patterned structure 210 of EMI sheet attenuator 200. In this view, patterned structure 210 will be a three-dimensional structure having a height H, width W, and length L.

Figure 7:
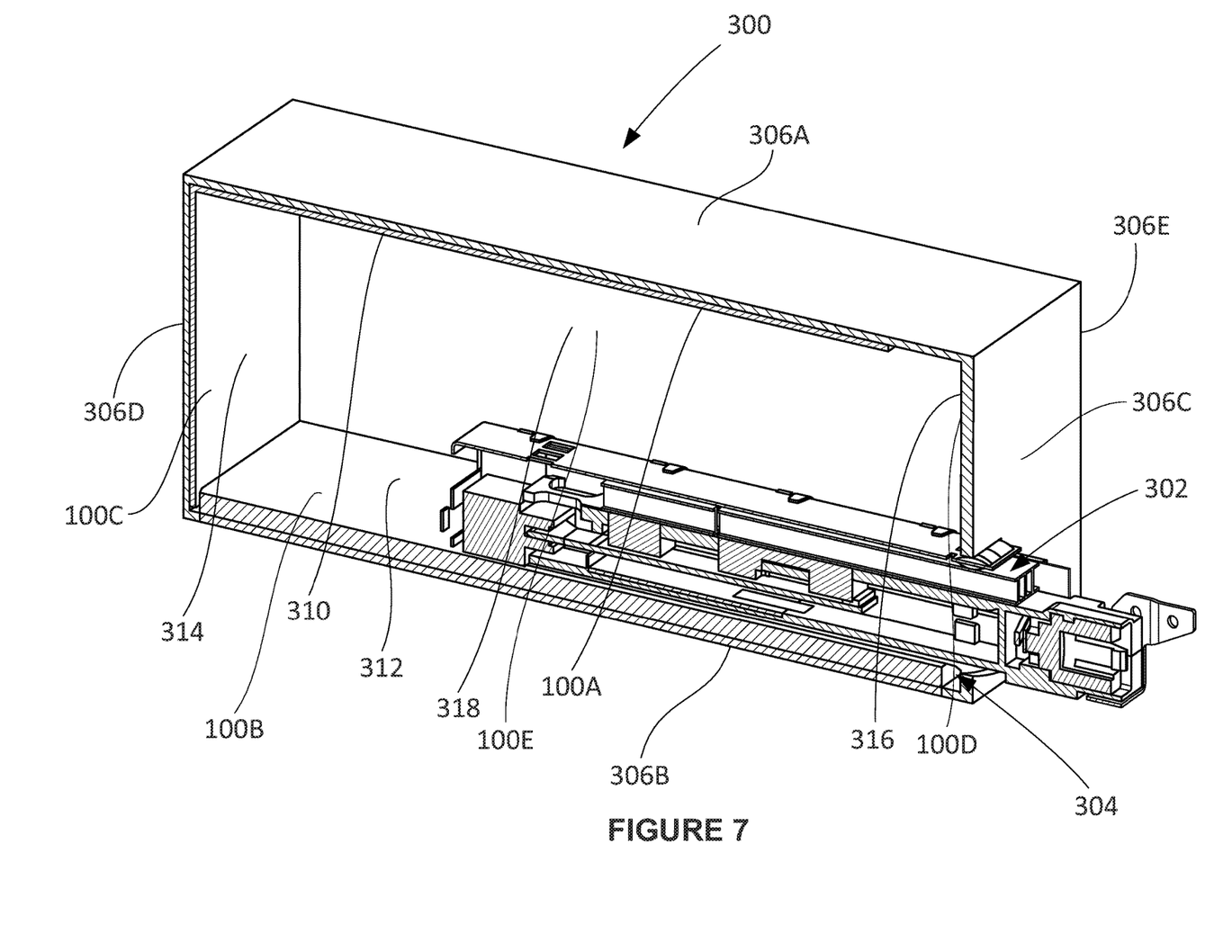
FIG. 7 is a cross-sectional perspective view of an enclosure with electromagnetic sheet attenuators and an electronic device therein.

An EMI sheet attenuator according to aspects of the disclosure may be used to reduce radiated emission levels generated by an electronic device within an enclosure. Such EMI sheet attenuator can be provided onto one or more walls of an enclosure for an electronic device, including directly on a housing of an electronic device, or an enclosure built to contain electronic device. A cross-section of an example enclosure 300 with an electronic device 302 within the enclosure 300 is shown in FIG. 7. In this example, the enclosure includes six sides: top side 306A, bottom side 306B, right side 306C, left side 306D, back 306E and front (not shown in the cross-section). A portion of electronic device 302 is housed within enclosure 300, while another portion of electronic device 302 extends through an aperture 304 in right side wall surface 306C of enclosure 300 so that the electronic device 302 is exposed outside of enclosure 300. In other examples, enclosure 300 may be fully enclosed to include all six sides of electronic device, or enclosure 300 may only partially enclose an electronic device, such that the enclosure includes less than six sides.

To minimize radiated emissions, an EMI sheet attenuator may be applied to one or more surfaces on an enclosure. For purposes of discussion, reference will be made to use of EMI sheet attenuator 100 within an enclosure to reduce radiated emissions. However, sheet attenuator 200 or other sheet attenuators formed according to aspects of the disclosure may be utilized.

In one example, EMI sheet attenuators 100A, 100B, 100C, 100D, 100E, and 100F (not shown), which are each individually identical to the pattern and characteristics of EMI sheet attenuator 100, are applied to the respective interior top surface 310, bottom surface 312, opposed edge surfaces 314, 316, rear surface 318, and front surface (not shown in the cross-sectional view). As shown, EMI sheet attenuators 100A, 100B, 100C, 100D, 100E, and 100F are applied to the entirety of the respective surfaces to which they are applied, but in other examples, one or more of EMI sheet attenuators 100A, 100B, 100C, 100D, 100E, and 100F may be applied to only a portion of one or more surfaces to which it is applied. An EMI sheet attenuator may also be applied directly to a housing of the electronic device 302 within enclosure 300. For ease of illustration, the patterns 110 are not shown on the interior surface of enclosure 300, but it is to be understood that in this example, EMI sheet attenuators 100A, 100B, 100C, 100D, 100E, and 100F, each having the pattern shown in FIG. 1, are applied to an entirety of the interior surfaces of enclosure 300.

When electronic device 302 is in use, electronic device 302 will emit radiated emissions that may be reflected within the enclosure or escape through the walls of the enclosure, thereby causing interference and the like. The patterned structure 110 of each respective EMI sheet attenuator 100 can be designed to block specific frequencies of radiated emissions arriving at any angle and the frequency of the radiated emissions of an electronic device within the enclosure.

In one example implementation, electronic device 302 radiates emissions at 26.7 Ghz. When the EMI sheet attenuators were placed inside the enclosure, a 20 dB reduction was observed in the Total Radiated Power leaked from the enclosure and in Max E-Field measured outside the enclosure at 3 meters of distance.

Use of the EMI sheet attenuators is therefore shown to reduce electromagnetic field propagation within an enclosure, as compared to baseline electromagnetic field propagation within an enclosure that does not include EMI sheet attenuators. Thus, use of the EMI sheet attenuators 110A-F can provide a significant improvement from an enclosure that does not utilize EMI sheet attenuators 110A-F within an enclosure.

EMI sheet attenuators manufactured and implemented according to aspects of the disclosure provide significant flexibility for a designer to block and/or absorb radiated emissions of an electronic device within an enclosure. This flexibility may be beneficial when the electronic device within the disclosure is still being designed, and the radiated emissions are subject to change. Providing the ability for a user to attenuate radiated emissions by simply changing EMI sheet attenuators attached to a wall, as opposed to redesigning the enclosure, portions of the housing of the electronic device, components within the electronic device, printed circuit board, and the like may also be beneficial.

Design of the EMI sheet attenuator to attenuate an impedance of an electromagnetic field generated by an electronic device can depend on many factors, including the patterned structure, the number of layers, and the properties of the substrates. The dielectric properties of the substrate layers may be altered to impact the effectiveness of the patterned structure. For example, the thickness of the material forming the substrate layer, the dielectric constant of the material, tangent loss and the like can be modified to reduce the size of the printed shapes of the patterned structure on a given substrate layer or to make the same printed structure work at a different frequency. The spacing between the layers can also make a difference, which can be directly affected by the thickness of the adhesive layers used to attach the individual substrate layers together, which also affects how close together the substrate layers are positioned and how the electromagnetic wave propagates through EMI sheet attenuators. Thus, many factors can be taken into consideration when deigning EMI sheet attenuator 100.

It is to be appreciated that EMI sheet attenuators manufactured according to aspects of the disclosure can be effective even when the impinging wave does not come at a 90 degree angle from the structure. EMI sheet attenuators are also equally effective to impinge waveforms in both near field, which is the field near the emitting electronic device or component, and far field, which is the field further away from the electronic device or component because their effectiveness depends on their impedance which can be adjusted on a case by case. This is in contrast to prior EMI shields and/or attenuators that may only be designed to be more effective in a certain field configuration. EMI sheet attenuators may also be broadband.

Implementation of the devices and methods disclosed herein can provide cost effective improvements across many applications. Such sheets can be used inside consumer electronic products (cell phones, laptops, google home) to increase isolation between antennas and to solve de-sense and coexistence problems. In the design or manufacture of servers, high-performance computing, and networks, individual EMI frequency sheets can be used to suppress radiated emissions without redesigning the enclosure or without the need to increase the overall shielding over the entire frequency range. Specific high frequencies may also be suppressed using the sheets disclosed herein for optical transceivers without a further increase in shielding performance due to the need for the design to include certain apertures (such as the main aperture needed for optical fibers to connect with their modules). Improvements can now be made to the coexistence and de-sense performance of devices at specific frequencies, such as WiFi, Bluetooth, and the like. Additionally, radiated emissions can be decreased when a non-metallic enclosure is used or when an imperfect shielding enclosure has to be used. Such EMI sheet attenuators may also be used in other applications, such as protective shielding within clothing, bags, and other accessories. In general, compliance with electromagnetic compatibility ("EMC") regulatory RE limits can be achieved from the methods and devices disclosed herein.

It is to be understood that the figures and descriptions of the present disclosure have been simplified to illustrate elements that are relevant for a clear understanding of the present disclosure, while eliminating, for purposes of clarity, many other elements which are conventional in this art. Those of ordinary skill in the art will recognize that other elements may be desirable for implementing the present disclosure.

It is noted that the terminology used above is for the purpose of reference only, and is not intended to be limiting. For example, terms such as "upper," "lower," "above," "below," "rightward," "leftward," "clockwise," and "counterclockwise" refer to directions in the drawings to which reference is made. As another example, terms such as "inward" and "outward" may refer to directions toward and away from, respectively, the geometric center of the component described. As a further example, terms such as "front," "rear," "side," "left side," "right side," "top," "bottom," "inner," "outer," "horizontal," and "vertical" describe the orientation of portions of the component within a consistent but arbitrary frame of reference which is made clear by reference to the text and the associated drawings describing the component under discussion. Such terminology will include the words specifically mentioned above, derivatives thereof, and words of similar import.

While the embodiments disclosed herein have been described in detail, it is evident that many alternatives, modifications, and variations will be apparent to those skilled in the art. Indeed, the disclosure set forth herein includes all possible combinations of the particular features set forth above, whether specifically disclosed herein or not. For example, where a particular feature is disclosed in the context of a particular aspect, arrangement, configuration, or embodiment, that feature can also be used, to the extent possible, in combination with and/or in the context of other particular aspects, arrangements, configurations, and embodiments. Moreover, the disclosure set forth herein includes the mirror image, i.e., mirror configuration, taken from any perspective of any drawing or other configuration shown or described herein. Accordingly, aspects of the disclosure as set forth above are intended to be illustrative, not limiting. Various changes may be made without departing from the spirit and scope of the subject matter as defined in the following claims.

The invention claimed is:

1. An electromagnetic interference ("EMI") sheet attenuator comprising:
   a planar conductive layer having a major surface;
   a first flexible substrate overlying the planar conductive layer and including a first plurality of conductive patterns thereon, the first flexible substrate being a continuous and planar substrate extending continuously across the major surface of the planar conductive layer; and
   a second flexible substrate overlying the first flexible substrate and including a second plurality of conductive patterns thereon the second flexible substrate extending continuously across the major surface of the planar conductive layer,
   wherein the plurality of second conductive patterns on the second flexible substrate are aligned with the plurality of first conductive pattern on the first flexible substrate, and
   wherein the first and second flexible substrates are comprised of a transparent material.

2. The EMI sheet attenuator of claim 1, wherein the EMI sheet attenuator is configured to reflect wave impedance in both a near field and a far field.

3. The EMI sheet attenuator of claim 1, wherein the first and second flexible substrates each further include a top surface and an opposed bottom surface, and wherein the plurality of first and second conductive patterns are respectively disposed at the top surface of the first flexible substrate and the top surface of the second flexible substrate.

4. The EMI sheet attenuator of claim 3, wherein the planar conductive layer further includes a top surface and an opposed bottom surface, wherein the bottom surface of the first flexible substrate is joined to the top surface of the planar conductive layer.

5. The EMI sheet attenuator of claim 4, wherein an adhesive layer joins the first flexible substrate and the planar conductive layer together.

6. The EMI sheet attenuator of claim 5, wherein the adhesive layer is a first adhesive layer, and a second adhesive layer bonds the first and second flexible substrates together.

7. The EMI sheet attenuator of claim 1, wherein the planar conductive layer is comprised of a metal material.

8. The EMI sheet attenuator of claim 7, wherein the metal material is a sheet of metal material.

9. The EMI sheet attenuator of claim 7, wherein the planar conductive layer further includes a substrate and a layer of metal material disposed at the substrate.

10. The EMI sheet attenuator of claim 1, wherein the first flexible substrate is comprised of a paper material.

11. The EMI sheet attenuator of claim 1, wherein the plurality of first conductive patterns on the first flexible substrate are is-comprised of a conductive ink material.

12. The EMI sheet attenuator of claim 1, wherein the first and second substrates are bonded together by compression.

13. An enclosure for an electronic device comprising:
at least a first wall and a second wall joined together at their respective ends, the first wall having a first interior surface and the second wall having a second interior surface;
a first flexible electromagnetic interference ("EMI") sheet attenuator positioned at the first interior surface;
a second flexible EMI sheet attenuator positioned at the second interior surface;
wherein each of the first and second EMI sheet attenuators includes:
a planar conductive layer;
a first flexible substrate overlying the planar conductive layer and including a first plurality of conductive patterns thereon; and
a second flexible substrate overlying the first flexible substrate and including a second plurality of conductive patterns thereon,
wherein the first and second plurality of conductive patterns on the first and second flexible substrates of each of the first and second flexible EMI sheet attenuators are aligned with one another,
wherein the first and second flexible substrates of each of the first and second EMI sheet attenuators are comprised of a transparent material, and
wherein each of the first flexible substrates of the first and second EMI sheet attenuators is a continuous and planar substrate extending continuously across the major surface of the respective planar conductive layers, and wherein each of the second flexible substrates of the first and second EMI sheet attenuators extend continuously across the major surface of the respective planar conductive layers.

14. The enclosure of claim 13, wherein the first and second plurality of conductive patterns on the first and second flexible substrates are periodic structures.

15. The enclosure of claim 13, wherein the first and second plurality of conductive patterns on the first and second flexible substrates are different.

16. The enclosure of claim 13, further comprising a third wall, a fourth wall, a fifth wall, and a sixth wall that together with the first and second walls extend about all sides of the electronic device, and further including a third EMI sheet attenuator attached to the third wall; a fourth EMI sheet attenuator attached to the fourth wall; a fifth EMI sheet attenuator attached to the fifth wall; and a sixth EMI sheet attenuator attached to the sixth wall.

17. The enclosure of claim 13, wherein the first and second plurality of conductive patterns disposed at the first and second flexible substrates of the first and second EMI sheet attenuators are comprised of conductive ink material.

18. The enclosure of claim 13, wherein the planar conductive layers of the respective first and second EMI sheet attenuators further include a top surface and an opposed bottom surface, and wherein each of the bottom surfaces of the first and second flexible substrates is joined to the top surface of the planar conductive layer.

19. The enclosure of claim 13, wherein an adhesive layer of at least one of the first and second EMI sheet attenuators joins the first flexible substrate and the planar conductive layer together.

20. The enclosure of claim 13, wherein the first and second EMI sheet attenuators are configured to reflect wave impedance in both a near field and a far field.

* * * * *